(12) United States Patent
Nomura et al.

(10) Patent No.: US 8,230,370 B2
(45) Date of Patent: Jul. 24, 2012

(54) CIRCUIT DESIGN ASSISTING APPARATUS, COMPUTER-READABLE MEDIUM STORING CIRCUIT DESIGN ASSISTING PROGRAM, AND CIRCUIT DESIGN ASSISTING METHOD

(75) Inventors: Tomokazu Nomura, Kawasaki (JP); Hideaki Katagiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 339 days.

(21) Appl. No.: 12/507,411

(22) Filed: Jul. 22, 2009

(65) Prior Publication Data

US 2010/0023898 A1    Jan. 28, 2010

(30) Foreign Application Priority Data

Jul. 28, 2008    (JP) .................................. 2008-193001

(51) Int. Cl.
*G06F 17/50*    (2006.01)
(52) U.S. Cl. .............. 716/55; 716/53; 716/101; 716/136
(58) Field of Classification Search .................... 716/53, 716/55, 101, 136
See application file for complete search history.

(56) References Cited

U.S. PATENT DOCUMENTS 7,281,232 B1 * 10/2007 Nicolino et al. .............. 716/112

FOREIGN PATENT DOCUMENTS

JP    2005100171 (A)    4/2005

OTHER PUBLICATIONS

Japanese Office Action issued Apr. 3, 2012 in corresponding Japanese Patent Application 2008-193001 (3 pages) (1 page English translation).

* cited by examiner

*Primary Examiner* — Thuan Do
(74) *Attorney, Agent, or Firm* — Staas & Halsey LLP

(57) ABSTRACT

A circuit design assisting apparatus for assisting designing of a circuit is provided. The apparatus includes a storage unit that stores information regarding a configuration of components used in a design-target circuit and wirings between the components, an acquiring unit that acquires label setting information that associates a label with the configuration information indicating the components of the design-target circuit and the wirings between the components, a selecting unit that selects, from the storage unit, information having a configuration that matches the configuration information included in the acquired label setting information. and a setting unit that sets a label that is associated with the configuration information by the acquired label setting information to the information selected by the selecting unit and registering the set label in the storage unit.

17 Claims, 17 Drawing Sheets

FIG. 4

```
OBJECT CHECK1 ;
  CLASS .......... ;
    ........................
    ........................
    ........................
  CLASS .......... ;
    ........................
    ........................
    ........................

OBJECT CHECK2 ;
  CLASS .......... ;
    ........................
    ........................
    ........................
  CLASS .......... ;
    ........................
    ........................
    ........................

OBJECT DEFAULT ;
  CLASS .......... ;
    ........................
    ........................
    ........................
  CLASS .......... ;
    ........................
    ........................
    ........................
```

FIG. 5

```
CLASS NetCode1 CODE 1 ;
   ......................
     ....................
       ..................
CLASS NetCode2 CODE 2 ;
   ......................
     ....................
       ..................
    .....................
   ......................
  .......................
```

FIG. 6

```
CLASS NetCode3 CODE 3(N=1) 4(N>=2&N<=5) 5(N>5) ;
   ......................
     ....................
       ..................
```

FIG. 7

```
CLASS NetCode1 CODE 1 PRIORITY 2 ;
   .....................
     .....................
     .....................
   CLASS NetCode2 CODE 2 PRIORITY 1 ;
     .....................
     .....................
     .....................
   .....................
   .....................
   .....................
```

FIG. 8

```
CLASS NetCode1 CODE 1 PRIORITY 1 ;
  DIRECTION FORWARD ;
    START ................;
    END ...................;
  DIRECTION BACKWARD ;
    START ................;
    END ................;
.....................
.....................
.....................
```

FIG. 9

```
CLASS NetCode1 CODE 1 PRIORITY 1 ;
  DIRECTION FORWARD ;
    START MACRO(CELL_INV1,..) ;
    END MACRO(CELL_BUF2,..) ;
 ......................
 ......................
 ......................
```

FIG. 10

```
CLASS NetCode1 CODE 1 PRIORITY 1 ;
  DIRECTION FORWARD ;
    START MACROKIND(CLOCK8,..) ;
    END MACROKIND(INVERTER,BUFFER,..) ;
 ......................
 ......................
 ......................
```

FIG. 11

```
CLASS NetCode1 CODE 1 PRIORITY 1 ;
  DIRECTION FORWARD ;
    START INSTANCE(A1/B1/AAB4B,..) ;
    END INSTANCE(A1/B1/AAB4D,..) ;
........................
........................
........................
```

FIG. 12

```
CLASS NetCode1 CODE 1 PRIORITY 1 ;
  DIRECTION FORWARD ;
    START PIN(SO,SO[1],SO[2],..) ;
    END PIN(SI,..) ;
........................
........................
........................
```

FIG. 13

```
CLASS NetCode1 CODE 1 PRIORITY 1 ;
  DIRECTION FORWARD ;
    START PINKIND(SCAN_OUT,..) ;
    END PINKIND(SCAN_IN,..) ;
........................
........................
........................
```

FIG. 14

```
CLASS NetCode1 CODE 1 PRIORITY 1 ;
  DIRECTION FORWARD ;
    START  MACROPIN({MACRO}CELL_INV1+{PIN}X,..) ;
    END MACROPIN({MACRO}CELL_BUF2+{PIN}A,..) ;
........................
........................
........................
```

FIG. 15

```
CLASS NetCode1 CODE 1 PRIORITY 1 ;
 DIRECTION FORWARD ;
   START NET(A1/B1/A27D[1],..) ;
   END NET(A1/B1/A27D[2],..) ;
   ....................
   ....................
   ....................
```

FIG. 16

```
CLASS NetCode1 CODE 1 PRIORITY 1 ;
 DIRECTION FORWARD ;
   START .................. ;
   END STEP(5) ;
   ....................
   ....................
   ....................
```

FIG. 17

```
CLASS NetCode1 CODE 1 PRIORITY 1 ;
  DIRECTION FORWARD ;
    START .................. ;
    END FUNC(MULTI_FANOUT_NET,3_INPUT_MACRO,..) ;
..........................
..........................
..........................
```

FIG. 18

```
CLASS NetCode1 CODE 1 PRIORITY 1 ;
  DIRECTION FORWARD ;
    START GROUP(EFB1,..) ;
    END GROUP(EFB2,..) ;
..........................
..........................
..........................
```

FIG. 19

```
GROUP EFB11 ;
  MACRO(CELL_INV1,..) ;
  MACROKIND(BUFFER,..) ;
  INSTANCE(A1/B1/AAB4B,..) ;
GROUP EFB22 ;
  PIN(SI,..) ;
  PINKIND(SCAN_OUT,..) ;
................................
................................
................................
```

FIG. 20

```
CLASS NetCode1 CODE 1 PRIORITY 1 ;
  DIRECTION FORWARD ;
    START NET(A1/B1/A27D[*],..) ;
    END NET(A1/B1/A27D[*],..) ;
................................
................................
................................
```

FIG. 21

```
CLASS NetCode1 CODE 1 PRIORITY 1 ;
  DIRECTION FORWARD ;
    START MACRO(CELL_INV1,..) ;
       PIN(SO,..) ;
    END MACRO(CELL_BUF2,..) ;
       PIN(SI,..) ;
..............................
..............................
..............................
```

FIG. 22A

| MACRO NAME | CLK_CHOP_A |
|---|---|
| MACRO KIND NAME | CHOPPER |
| PIN NAME | PIN KIND NAME |
| A | CLOCK_IN |
| X | CLOCK_OUT |

FIG. 22B

| MACRO NAME | LATCH_4B |
|---|---|
| MACRO KIND NAME | LATCH |
| PIN NAME | PIN KIND NAME |
| CK | CLOCK_IN |
| LD[1-4] | DATA_IN |
| IH | CLOCK_INH |
| SI | SCAN_IN |
| SO | SCAN_OUT |

FIG. 24

```
OBJECT CHECK1 ;
 CLASS Clock7 CODE 7 PRIORITY 4 ;
   DIRECTION FORWARD ;
     START MACROPIN({MACRO}CLK_BUF7+{PIN}X) ;
     END MACRO(CLK_BUF8) ;
 CLASS Clock8 CODE 8 PRIORITY 3 ;
   DIRECTION FORWARD ;
     START MACROPIN({MACRO}CLK_BUF8+{PIN}X) ;
     END MACRO(CLK_CHOP_A) ;
 CLASS ClockChop CODE 10 PRIORITY 1 ;
   DIRECTION FORWARD ;
     START
MACROPIN({MACROKIND}CHOPPER+{PINKIND}CLOCK_OUT) ;
     END MACROKIND(LATCH) ;
 CLASS ClockInh CODE 20 PRIORITY 20 ;
   DIRECTION BACKWARD ;
     START PINKIND(CLOCK_INH) ;
     END STEP(1) ;
 CLASS ScanData CODE 30 PRIORITY 30 ;
   DIRECTION FORWARD ;
     START PINKIND(SCAN_OUT) ;
     END MACROKIND(LATCH) ;
   DIRECTION BACKWARD ;
     START PINKIND(SCAN_IN) ;
     END MACROKIND(LATCH) ;
 CLASS ClockData CODE 40 PRIORITY 60 ;
   DIRECTION BACKWARD ;
     START PIN(LD[*],LDA[*]) ;
        MACROPIN({MACROKIND}RAM+{PINKIND}DATA_IN) ;
     END FUNC(MULTI_INPUT_MACRO) ;
 CLASS TestMode1 CODE 50 PRIORITY 50 ;
   DIRECTION FORWARD ;
     START MACRO(TEST_BUF) ;
     END STEP(1) ;
 CLASS TestMode2 CODE 51 PRIORITY 51 ;
   DIRECTION FORWARD ;
     START NET(A1/B1/LL[5]) ;
     END INSTANCE(A1/B1/ABC05) ;
OBJECT CHECK2 ;
 CLASS .................... ;
   DIRECTION ............. ;
     START    ................ ;
     END      ................ ;

.............
```

CIRCUIT DESIGN ASSISTING APPARATUS, COMPUTER-READABLE MEDIUM STORING CIRCUIT DESIGN ASSISTING PROGRAM, AND CIRCUIT DESIGN ASSISTING METHOD

CROSS-REFERENCE TO RELATED APPLICATION

This application is related to and claims priority to Japanese Patent Application No. 2008-193001, filed on Jul. 28, 2008, and incorporated herein by reference.

FIELD

An embodiment discussed herein relates to a circuit design assisting apparatus for assisting physical design of a large-scale integrated circuit (LSI).

BACKGROUND

With recent miniaturization of transistors, the integrity of LSIs is increasing, which leads to an increase in the number of gates and the complexity of logic in LSI designing.

At the time of checking LSI in an LSI designing process, a label (hereinafter, referred to as a "netcode") is set to a configuration pattern constituted by components, such as, for example, a diode and a transistor, and wirings between terminals of the components to efficiently perform a test. Hereinafter, the "configuration pattern" and the "label" are referred to as a "net" and a "netcode", respectively.

An overview of an LSI designing process will now be described with reference to a flowchart illustrated in FIG. 1.

First, logic design for performing function verification, such as feasibility study and die-size estimation, is carried out (S101). Physical design, such as creation of a netlist, cell arrangement, and wiring design, is then carried out (S102). After a design rule check, in which whether a designed LSI is compliant with a design rule is checked (S103), an LSI manufacturing process is started (S104).

A detail of the physical designing process illustrated at S102 in FIG. 1 will be described with reference to FIG. 2 next.

In the LSI physical design, a netlist containing information regarding connections between respective terminals of an LSI is created (S110). A layout database containing information regarding components and wirings embedded in the LSI is created (S111). Thereafter, a cell arrangement is designed (S112). Various wirings, such as power wiring, clock wiring, and general wiring, are then designed (S113, S114, and S115, respectively).

Thereafter, a timing check for checking and verifying a variance of LSI internal clock is carried out (S116). Various checks, such as a crosstalk noise check, are then performed (S117).

As described above, a netcode may be set for a net to efficiently perform various check and layout works. In general, a configuration of a target netcode differs depending on various check items.

The netcode has to be correctly set in a short period of time. However, in the related art, netcodes have to be set separately for nets with a user's manual operation, or a tool capable of processing a single net at a time. A complex circuit cannot be handled with such methods. Even if the complex circuit is coped with, the work for setting a netcode for each of hundred-thousands or millions of nets takes considerable time, which may also cause a problem with regard to a time for completion.

In addition, many netcode-setting errors occur. When a wrong netcode is set, the following various check works are not properly carried out, which may result in a problem that an LSI does not correctly work.

Furthermore, a configuration of target nets may differ depending on check items. In such a case, netcodes have to be switched in accordance with the difference in the configuration.

SUMMARY

It is an aspect of the embodiments discussed herein to provide a circuit design assisting apparatus for assisting designing of a circuit including a storage unit that stores information regarding a configuration of components used in a design-target circuit and wirings between the components, an acquiring unit that acquires label setting information that associates a label with the configuration information indicating the components of the design-target circuit and the wirings between the components, a selecting unit that selects, from the storage unit, information having a configuration that matches the configuration information included in the acquired label setting information, and a setting unit that sets a label that is associated with the configuration information by the acquired label setting information to the information selected by the selecting unit and registering the set label in the storage unit.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 4 illustrates an external parameter file according to an embodiment;

FIG. 5 illustrates an external parameter file according to an embodiment;

FIG. 6 illustrates an external parameter file according to an embodiment;

FIG. 7 illustrates an external parameter file according to an embodiment;

FIG. 8 illustrates an external parameter file according to an embodiment;

FIG. 9 illustrates an external parameter file according to an embodiment;

FIG. 10 illustrates of an external parameter file according to an embodiment;

FIG. 11 illustrates of an external parameter file according to an embodiment;

FIG. 12 illustrates an external parameter file according to an embodiment;

FIG. 13 illustrates an external parameter file according to an embodiment;

FIG. 14 illustrates an external parameter file according to an embodiment;

FIG. 15 illustrates an external parameter file according to an embodiment;

FIG. 16 illustrates an external parameter file according to an embodiment;

FIG. 17 illustrates an external parameter file according to an embodiment;

FIG. 18 illustrates an external parameter file according to an embodiment;

FIG. 19 illustrates group definition according to an embodiment;

FIG. 20 illustrates an external parameter file according to an embodiment;

FIG. 21 illustrates an external parameter file according to an embodiment;

FIGS. 22A and 22B illustrate exemplary macro definitions according to an embodiment;

FIG. 24 illustrates an external parameter file according to an embodiment;

DESCRIPTION OF THE EMBODIMENTS

Setting of a netcode according to an exemplary embodiment will be described below with reference to the accompanying drawings. In a netcode setting method according to an exemplary embodiment, a netcode is set in accordance with an external parameter file that is created in accordance with a predetermined description rule.

Figure 1:
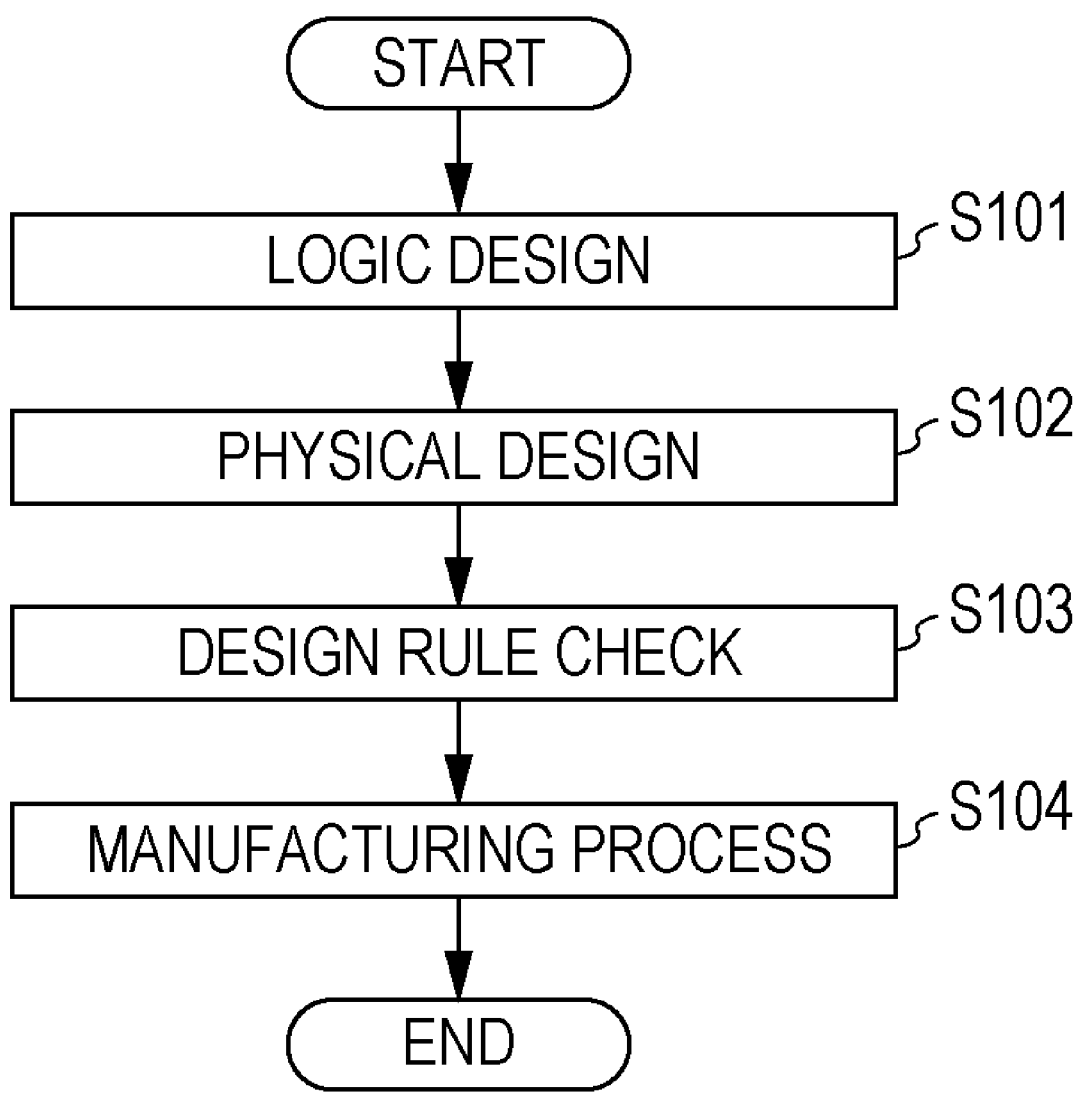
FIG. 1 is a flowchart illustrating LSI manufacturing.
Figure 2:
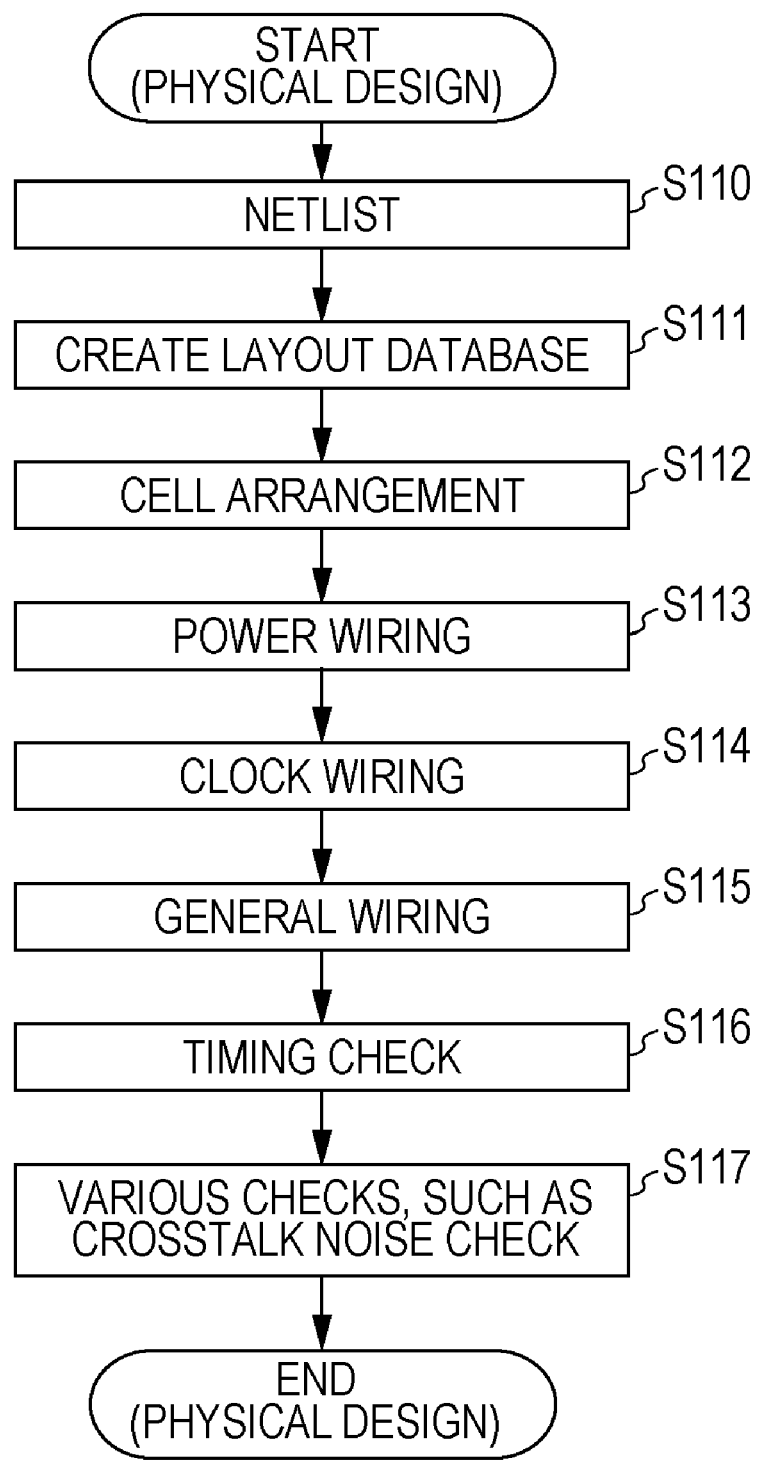
FIG. 2 is a flowchart illustrating an LSI physical designing process.
Figure 3:
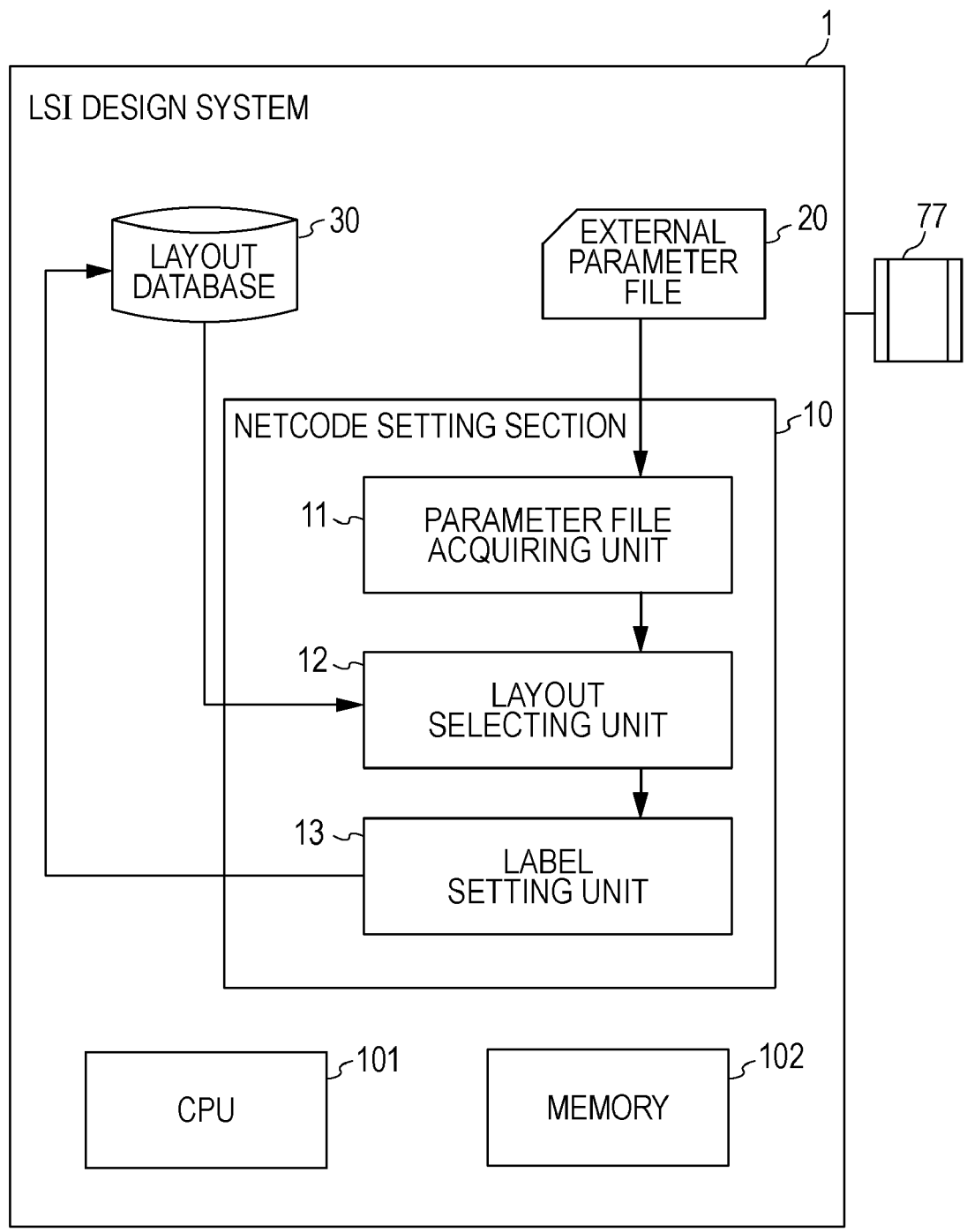
FIG. 3 illustrates an LSI design system according to an exemplary embodiment.

FIG. 3 illustrates a configuration of an LSI design system according to an embodiment. An LSI design system 1, which is an example of a circuit design assisting apparatus, includes a netcode setting section 10, an external parameter file 20, and a layout database 30 therein.

The netcode setting section 10 acquires information contained in the external parameter file 20, and to set a label for a net based on the content of the external parameter file 20. The netcode setting section 10 corresponds to a parameter file acquiring unit 11, a layout selecting unit 12, and a label setting unit 13.

The external parameter file 20 is a definition file created in accordance with a predetermined description rule. The external parameter file 20 includes a list of setting rules that represents a configuration of a part of a design-target circuit by information regarding components and wirings between the components. A correspondence between configuration information and a predetermined label is listed in the external parameter file 20 based on the description rule. Hereinafter, the information indicating the correspondence between the setting rule and the label is referred to as "label setting information" if necessary.

The layout database 30 stores nets represented by information regarding components used in a design-target LSI and wirings between the components.

The parameter file acquiring unit 11 acquires the external parameter file 20. Furthermore, the parameter file acquiring unit 11 acquires the label setting information from the external parameter file 20.

The layout selecting unit 12 selects a net that matches the setting rule indicated by the label setting information acquired by the parameter file acquiring unit 11, from the layout database 30.

The label setting unit 13 sets a label corresponding to the setting rule that matches the selected net for the net selected by the layout selecting unit 12.

The netcode setting section 10 may be realized by hardware resources of a central processing unit (CPU) 101 and a memory 102 including a volatile or nonvolatile storage device operate in cooperation with a program stored in the memory 102.

Although it is assumed that the external parameter file 20 and the layout database 30 are stored in the memory 102 in this embodiment, these pieces of information may be acquired from outside of the LSI design system 1, for example, from an external media 77.

A description rule of the external parameter file 20 will be described next.

FIG. 4 illustrates an example of the external parameter file 20 for setting a netcode in accordance with various check items. Since a configuration of a target netcode generally differs depending on various check items, a user can be allowed to specify the configuration of the netcode in accordance with the check items. When there are a plurality of check items, a plurality of rules are previously written in the external parameter file 20 in accordance with the check items.

The content illustrated in FIG. 4 will be described. As illustrated by "OBJECT CHECK 1" and "OBJECT CHECK 2", various check items are divided by an expression of "OBJECT ...".

When a user specifies, for example, "CHECK OBJECT 1" when executing process in the LSI design system 1, the netcode setting section 10 sets a netcode in an external parameter file based on the content of "OBJECT CHECK 1". Similarly, when the user specifies "CHECK OBJECT 2", the netcode setting section 10 sets a netcode in an external parameter file based on the content of "OBJECT CHECK 2".

When there is no user's specification regarding the check item when executing process in the LSI design system 1, the netcode setting section 10 sets a netcode in an external parameter file based on a rule written at "OBJECT DEFAULT".

Netcodes to be set in an external parameter file can be switched in accordance with various check items based on the above-described description rule. Accordingly, it is possible to categorize netcodes to be set in accordance with various check purposes and to previously write a plurality of netcodes.

Although parts represented as " ... " in the following drawings indicate information written in an external parameter file, specific descriptions thereof are omitted.

FIG. 5 is a diagram illustrating a description of a setting rule for each netcode. By setting the content illustrated in FIG. 5 in the external parameter file 20, the setting rule can be specified for each netcode and the setting rule can be associated with the netcode. More specifically, a netcode name and a netcode (or "label") are written in an external parameter file and a setting rule, corresponding to a part represented as " ... " in FIG. 5, for the netcode may be written under the description of the netcode name and the netcode, and the setting rule is associated with the netcode.

FIG. 5 illustrates an example in which a netcode name "NetCode1" is specified. In addition, "CODE 1" is a format for assigning "1" to the netcode. Similarly, "NetCode2" and "2" are assigned to the netcode name and the netcode in the example illustrated in FIG. 5, respectively.

Label setting information indicating a correspondence between the netcode and the setting rule represented by information regarding components and wirings therebetween is specified using "CLASS". More specifically, a line of "CLASS" or a content written between "CLASS" and ";" includes the netcode, whereas the setting rule is written in each line in the section of "CLASS".

The external parameter file 20 is set in a manner illustrated in FIG. 6 to specify a netcode, and the netcode can be set for each trace operation. An expression "3 (N=1)" illustrated in FIG. 6 is an example for assigning a netcode "3" to nets having the number of trace operations from a trace start point, which will be described later, that is equal to 1. An expression "4 (N>=2 & N<=5)" is an example for assigning a netcode "4" to nets having the number of trace operations from the trace start point that is equal to or greater than 2 and equal to or smaller than 5. In addition, an expression "5 (N>5)" is an example for assigning a netcode "5" to nets having the number of trace operations from the trace start point that is greater than 5.

A description rule of the external parameter file 20 employed in specifying the priority of process of the netcode setting section 10 will be described next. As illustrated in FIG. 7, when the priority for setting a label, such as "PRIORITY 1", is specified for a setting rule, corresponding to a dotted-line part illustrated in FIG. 7, for each netcode, the parameter file acquiring unit 11 acquires a pair of a netcode and a setting rule in accordance with the priority after acquiring the external parameter file 20. The layout selecting unit 12 selects, from the layout database 30, a net that matches the setting rule in accordance with the priority. The label setting unit 13 sets a netcode in accordance with the priority. For example, there may be a case where different netcodes are used in specification of a netcode using the number of trace operations as described above with reference to FIG. 6 and in specification of a netcode using the trace start point, a trace end point, and a tracing direction, which will be described later, and the different netcodes are assigned to the same net. When different netcodes are used as in this case, a netcode that is set previously, namely, a netcode having a higher priority, is assigned.

Since the priorities of "NetCode1" and "NetCode2" are "2" and "1", respectively, in FIG. 7, a setting rule of "Net-Code2" is processed before a setting rule of "NetCode1" is processed.

A description rule of a setting rule for identifying a net stored in the layout database 30 will be described next.

As illustrated in FIG. 8, a trace start point, a start point of a configuration, "START", a trace end point, an end point of the configuration, "END", and a tracing direction, a signal input/output direction, "DIRECTION" can be specified as a setting rule for the netcode name "1" and the netcode "1". The tracing direction indicates an actual signal input/output direction. "DIRECTION FORWARD" indicates specification of a tracing direction from a signal output to a signal input. "DIRECTION BACKWARD" indicates specification of a tracing direction from a signal input to a signal output. More specifically, "DIRECTION FORWARD" is a setting for selecting, from the layout database 30, a net in which a signal flows from a component specified by "START" to a component specified by "END". "DIRECTION BACKWARD" is a setting for selecting, from the layout database 30, a net in which a signal flows from a component specified by "END" to a component specified by "START".

A net that satisfies all of conditions set by "START", "END", and "DIRECTION" in the setting rule is selected from the layout database 30.

A description rule for setting the trace start point and the trace end point will be described next.

FIG. 9 illustrates an example of specifying the trace starting and end points using macro names. When a macro that is previously defined in the layout database 30, e.g., a macro having a macro name "CEL_INV1", is specified as the trace start point, "START MACRO(CELL_INV1, ... )" is written in an external parameter file. Similarly, when another previously defined macro, e.g., a macro having a macro name "CELL_BUF2", is specified as the trace end point, "END MACRO(CELL_BUF2, ... )" is written.

Likewise, the trace start point and the trace end point may be specified using a macro kind name, which is set as a kind of a macro. FIG. 10 illustrates a specification example of a macro kind name.

For example, as illustrated in FIG. 10, when a macro kind represented by a macro kind name previously defined in the layout database 30, e.g., "CLOCK8", is specified as the trace start point, "START MACROKIND(CLOCK 8, ... )" is written in the external parameter file 20. In addition, by writing "END MACROKIND(INVERTER, BUFFER, ... )" in the external parameter file 20, a net having macro kinds "INVERTER" and "BUFFER" at the trace end point is selected from the layout database 30.

Similarly, the trace start point and the trace end point may be specified using an instance name. FIG. 11 illustrates a specification example of an instance name.

As illustrated in FIG. 11, by writing "START INSTANCE (A1/B1/AAB4B, ... )" in the external parameter file 20, an instance represented by an instance name "A1/B1/AAB4B" defined in the layout database 30 is specified as the trace start point. Similarly, by writing "END INSTANCE(A1/B1/AAB4D, ... )" in the external parameter file 20, an instance defined to have an instance name "A1/B1/AAB4D" in the layout database 30 is specified as the trace end point.

In addition, by including a description illustrated in FIG. 12 in the external parameter file 20 as the trace start point and the trace end point, a pin, including a hierarchical pin, defined in the layout database 30 is specified as the trace start point or the trace end point. For example, when "START PIN(SO, SO[1], SO[2])" is written in the external parameter file 20, a net having all of pins represented by pin names "SO", "SO [1]", "SO[2]" at the trace start point is specified. Similarly, when "END PIN(SI), ... " is written in the external parameter file 20, a net having a pin represented by a pin name "S1" at the trace end point is specified.

FIG. 13 illustrates a content of the external parameter file 20 when the trace start point and the trace end point are specified using a pin kind name. Using a description illustrated in FIG. 13, pin kinds defined in the layout database 30 are specified as the trace start point and the trace end point as in the above-described case.

For example, when a pin kind name "SCAN_OUT" is specified as the trace start point, "START PINKIND (SCAN_OUT, ... )" is written in the external parameter file 20. In addition, when a pin kind name "SCAN_IN" is specified as the trace end point, "END PINKIND(SCAN_IN, ... )" is written in the external parameter file 20.

The trace start point and the trace end point may be specified using a macro name and a pin name. FIG. 14 illustrates an example including such specification.

Referring to FIG. 14, "START MACROPIN([MACRO] CELL_INV1+[PIN]X, ... )" is a description employed when a pin having a pin name "X" of a macro having a macro name "CELL_INV1" is specified as the trace start point. Additionally, "END MACROPIN([MACRO]CELL_BUF2+ [PIN]A, ... )" is a description employed when a pin having a pin name "A" of a macro having a macro name "CELL_BUF2" is specified as the trace end point. By setting the setting rule in this manner, the layout selecting unit 12 selects, from the layout database 30, a net in which the trace start point is constituted by "CELL_INV1" and "X", the trace end point is constituted by "CELL_BUF2" and "A", and the tracing direction is set as "FORWARD".

In addition to a macro name, a macro kind name and an instance name may be used to specify a macro. Additionally, a pin kind name as well as a pin name may be used to specify a pin.

By writing the external parameter file 20 as illustrated in FIG. 15, nets stored in the layout database 30 are specified as the trace start point and the trace end point.

For example, when a net having a net name "A1/B1/A27D [1]" is stored in the layout database 30, the net is specified as the trace start point by wiring "START NET(A1/B1/A27D [1], ... )" in the external parameter file 20. In addition, when a net having a net name "A1/B1/A27D[2]" is stored, the net is specified as the trace end point by writing "END NET(A1/B1/A27D[2], ... )" in the external parameter file 20.

FIG. 16 illustrates a description rule for specifying the trace end point using the number of trace operations. As illustrated in FIG. 16, for example, when the fifth operation from the trace start point is specified as the trace end point, "END STEP(5)" is written. In the case illustrated in FIG. 16, the layout selecting unit 12 selects all of nets having the number of operations from a predetermined trace staring point that is equal to 5 and the tracing direction "FORWARD". The label setting unit 13 sets a netcode "1" for all of the selected nets.

When the trace end point is specified using a keyword representing a feature of a circuit, the external parameter file 20 is written in a manner illustrated in FIG. 17. For example, an expression "END FUNC(MULTI_FANOUT_NET, 3_INPUT_MACRO, ... )" indicates that a net having a plurality of fun-outs and a macro having three input terminals is specified as the trace end point.

FIG. 18 illustrates an example for specifying the trace start point and the trace end point using a group name defined by a user. When the external parameter file 20 is written in a manner as illustrated by the example of FIG. 18, a user-defined group name "EFB1" is set as the trace start point, whereas a group name "EFB2" is set as the trace end point.

FIG. 19 illustrates definition of a group name specified by a user. By listing the above-described macro name, macro kind name, instance name, pin name, and pin kind name in specification of a group name in this manner, a group of the listed elements is specified as the trace start point and the trace end point. The layout selecting unit 12 selects a net having the trace start point or the trace end point that satisfies each of the elements represented by the group name.

This group name definition may be stored in the layout database 30 or may be written in the external parameter file 20. Needless to say, the group name definition may be stored as a file other than the external parameter file 20.

FIG. 20 illustrates an example in which each of the above-described definitions in the external parameter file 20 is carried out using a regular expression. When "START NET(A1/B1/A27D[*], ... )" is written in the external parameter file 20 as illustrated in FIG. 20, any components that match "A1/B1/A27D[*] ([*] may be a numeral value or a character" are selected as the trace start point. The same applies to the trace end point. Since the definition can be handled with the regular expression, a setting rule can be efficiently written.

Additionally, by writing the external parameter file 20 in a manner as illustrated in FIG. 21, it is possible to define the trace start point and the trace end point by using the specification methods described with reference to FIGS. 7-18. For example, when a configuration including a macro name "CELL_INV1" and a pin name "SO" is specified as the trace start point, "START MACRO(CELL_INV1, ... ); PIN(SO, ... );" is written as illustrated in FIG. 21. The same applies to the trace end point. Since the description methods can coexist in this manner, it is possible to write a setting rule for a complex circuit.

An operation according to this embodiment will be described next. FIGS. 22A and 22B illustrate an example of a macro previously defined in the layout database 30.

For example, as illustrated in FIG. 22A, a pin "A" having a pin kind name "CLOCK_IN" and a pin "X" having a pin kind name "CLOCK_OUT" are defined for a macro having a macro name "CLK_CHOP_A" and a macro kind name "CHOPPER".

Additionally, as illustrated in FIG. 22B, a pin "CK" having a pin kind name "CLOCK_IN" and pins "LD[1]-LD[4]" having a pin kind name "DATA_IN" are defined for a macro having a macro name "LATCH_4B" and a macro kind name "LATCH". In addition, a pin "IH" having a pin kind name "CLOCK_IN", a pin "SI" having a pin kind name "SCAN_IN", and a pin "SO" having a pin kind name "SCAN_OUT" are defined for the macro having a macro name "LATCH_4B".

Figure 23:
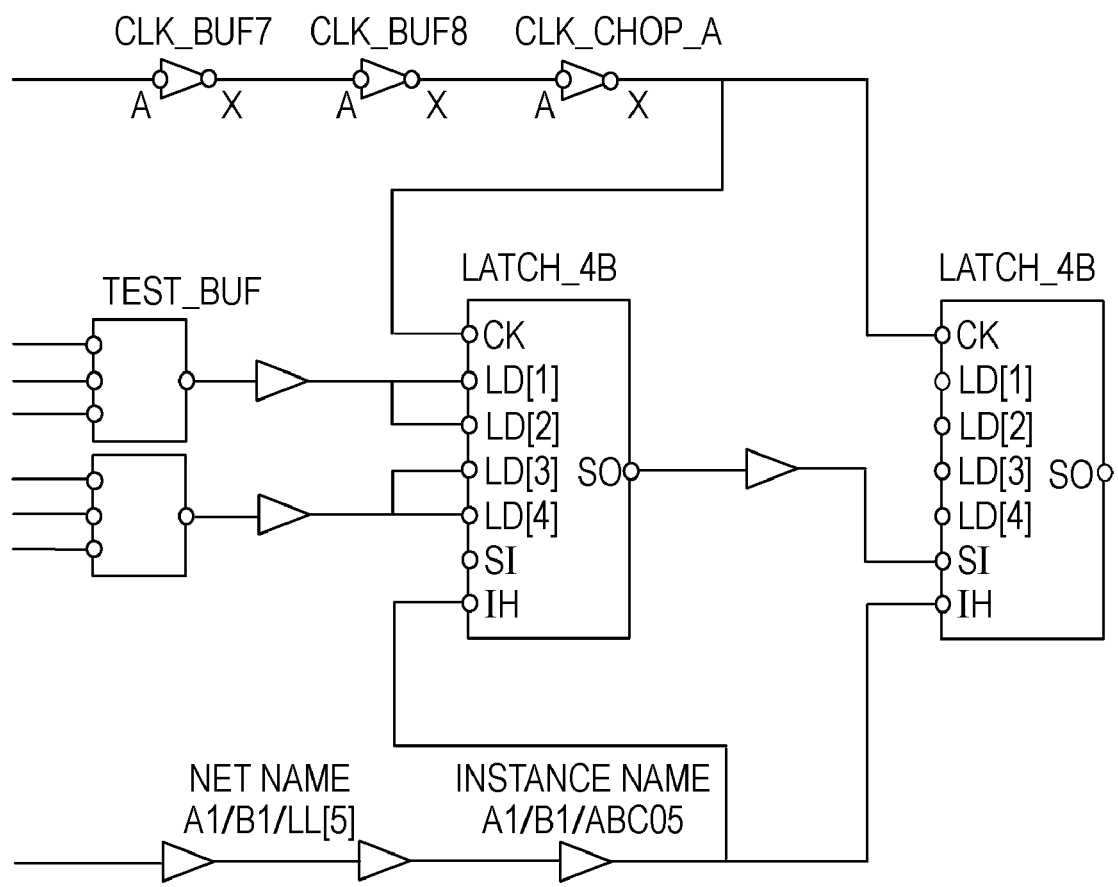
FIG. 23 illustrates a circuit diagram of a design target based on information previously stored in a layout database according to an embodiment.

FIG. 23 illustrates a circuit diagram of a design target based on information previously stored in the layout database 30. It is assumed that "CLK_CHOP_A" and "LATCH_4B" illustrated in FIG. 23 are defined in a manner illustrated in FIGS. 22A and 22B. It is also assumed that "CLK_BUF7", "CLK_BUF8", and "TEST_BUF" are macros previously defined in the layout database 30 as in the case of FIGS. 22A and 22B.

Additionally, it is assumed that information resulting in the circuit layout illustrated in FIG. 23 is set in the layout database 30. A description will be given for a case of setting a netcode for such circuit layout.

It is also assumed that a content of the external parameter file 20 is as illustrated in FIG. 24.

A description will be given for netcode names "Clock7" and "Clock8" as an example of the content illustrated in FIG. 24. The expression of the netcode name "Clock7" sets a netcode 7 for a net having the tracing direction "FORWARD", the trace start point specified by a pin name "X" of a macro name "CLK_BUF7", and the trace end point specified by a macro name "CLK_BUF8". The expression of the netcode name "Clock8" sets a netcode 8 for a net having the tracing direction "FORWARD", the trace start point specified by a pin name "X" of a macro name "CLK_BUF8", and the trace end point specified by a macro name "CLK_CHOP_A".

The same applies to other expressions. Since the contents of FIGS. 2-19 can be applied to the content of the external parameter file 20 illustrated in FIG. 24, a detailed description will be omitted here.

Figure 25:
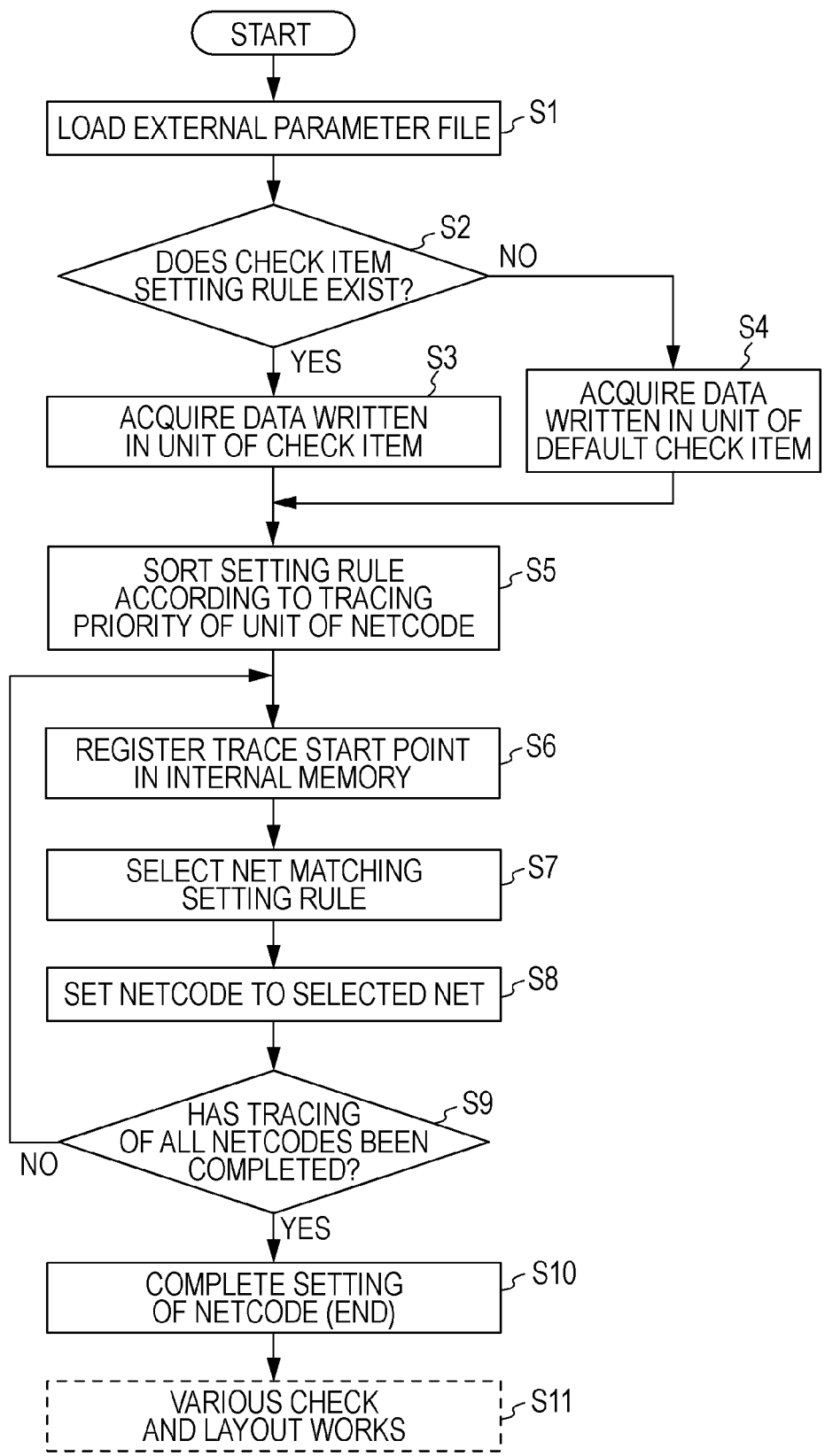
FIG. 25 is a flowchart illustrating process of an LSI design system according to an embodiment.

Process of the netcode setting section 10 of the LSI design system 1 based on information stored in the layout database 30 and a content written in the external parameter file 20 will be described with reference to a flowchart illustrated in FIG. 25. A netcode to be set in accordance with a check purpose may be supplied to a program of the LSI design system 1 that executes the processing illustrated in FIG. 25 by a user as an argument or the LSI design system 1 may acquire a value written in another configuration file.

The parameter file acquiring unit 11 loads the external parameter file 20 (S1). The parameter file acquiring unit 11 determines whether a rule for a check item ("OBJECT CHECK") is included in the external parameter file 20 (S2).

If the setting rule of the check item is included in the external parameter file 20 (YES at S2), the parameter file acquiring unit 11 acquires all of pieces of data written in a section for the check item acquired in the above-described manner from the external parameter file 20 (S3). Here, it is assumed that the acquired check item is "OBJECT CHECK1". On the other hand, if the setting rule of the check item is not included in the external parameter file 20 (NO at S2), the parameter file acquiring unit 11 acquires all pieces of data written in a section for a default check item from the external parameter file 20 (S4).

The parameter file acquiring unit 11 then sorts a pair of a netcode and a setting rule in accordance with the priority written at "PRIORITY" in the acquired pieces of data (S5). The layout selecting unit 12 and the label setting unit 13 then execute processing for each of the setting rules.

The layout selecting unit 12 reads out a trace start point written in the setting rule from the layout database 30 and registers the trace start point in the memory 102 (S6). The layout selecting unit 12 also registers a trace end point and a tracing direction in the memory 102 similarly.

The layout selecting unit 12 selects a net satisfying the setting rule from the layout database 30 (S7). The layout selecting unit 12 starts tracing from the trace start point and ends tracing at the trace end point, and selects a net having a signal input/output direction between the trace start point and the trace end point that matches the tracing direction. When a plurality of nets satisfying the setting rule exist, the layout selecting unit 12 selects all of the nets.

When the trace end point is specified using the number of operations, the layout selecting unit 12 selects a net having operations up to the number of operations specified as the trace end point from the trace start point. Furthermore, when the trace start point and the trace end point are written as a regular expression, the layout selecting unit 12 selects a net that satisfies the regular expression.

The label setting unit 13 sets a netcode corresponding to the processing-target setting rule for the net selected in the above-described manner (S8). The netcode is set by registering a label in the layout database 30 to make a correspondence between the net and the label clear. In addition, when a plurality of nets are selected, the label setting unit 13 sets the same label for all of the selected nets.

Processing at S6, S7, and S8 are repeated until netcodes are set for all of the nets (loop from NO at S9 to S6). If the netcodes are set for all of the setting rules (YES at S9), the netcode setting process terminates (S10).

Thereafter, various check and layout works are carried out based on the set netcodes in other processes (S11).

Figure 26:
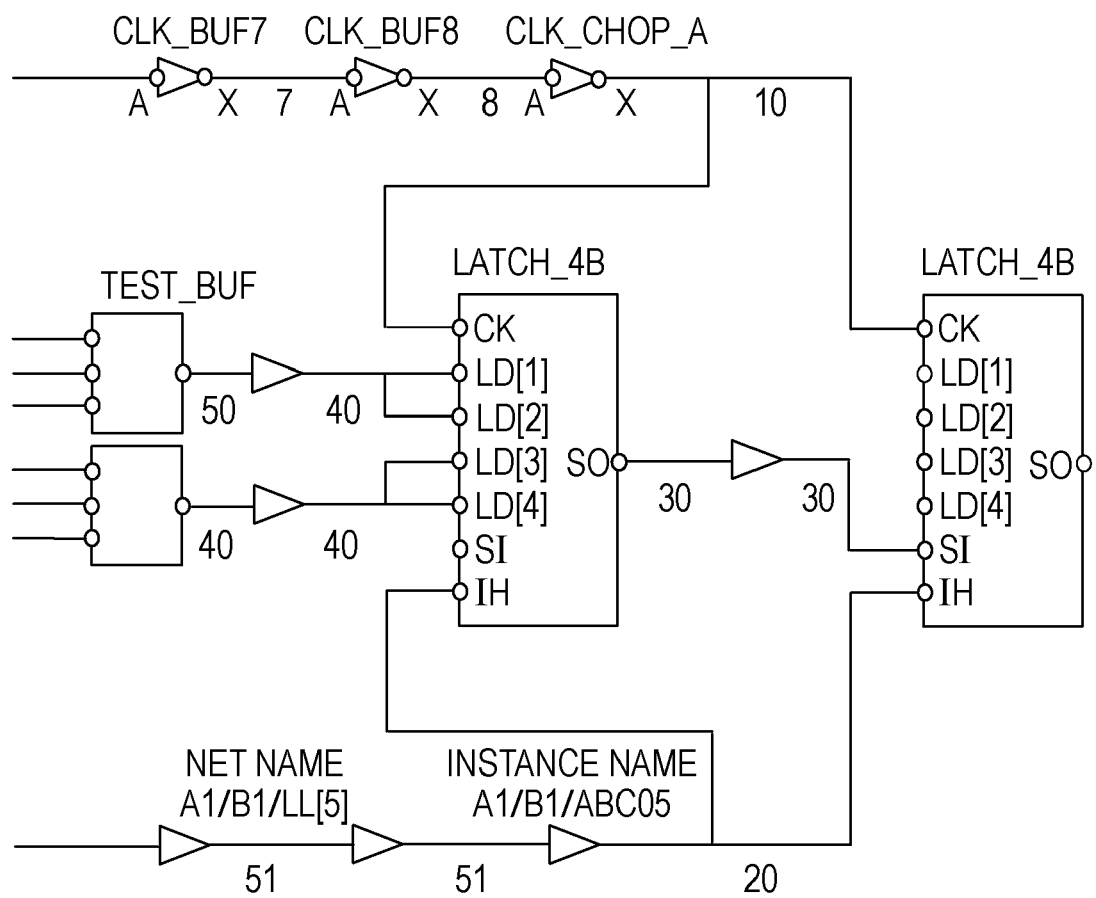
FIG. 26 is a circuit diagram in which netcodes are set for a circuit.

The netcodes are set in the above-described process. FIG. 26 illustrates a circuit diagram obtained by setting netcodes for the circuit illustrated in FIG. 23. For example, a netcode "7" is set for a configuration from "CLK_BUF7" to "CLK_BUF8", whereas a netcode "8" is set for a configuration from "CLK_BUF8" to "CLK_CHOP_A". In such a manner, a netcode is set for each net. The same netcode is set for nets satisfying the setting rule.

It is very difficult to cope with a complex circuit with a conventional method for individually setting a netcode for each net and setting of the netcode requires a lot of time. On the other hand, the LSI design system 1 according to an exemplary embodiment can automatically set netcodes in accordance with a setting rule written in the external parameter file 20, which thus realizes setting of netcodes in a complex circuit.

According to the embodiment, even when it is necessary to set netcodes for millions of nets, a user only has to create an external parameter file 20 including several tens of lines or several hundreds of lines at most. Thus, the user's work effort and work time can be significantly reduced.

In addition, according to the embodiment, by allowing netcodes that is set in an external parameter file to be switched in accordance with various check purposes, the set netcodes can be categorized in accordance with the purposes.

As described above, by setting netcodes in accordance with a setting rule of an external parameter file according to this embodiment, correct netcodes can be set for a complex circuit in accordance with various purposes. In addition, since processing can be executed in a short period of time, the netcode setting method according to this embodiment is more effective than a conventional netcode setting method.

A program for allowing a computer that constitutes a circuit design assisting apparatus to execute each of the above-described operations can be provided as a circuit design assisting program. The above-described program can be executed by the computer constituting a circuit design assisting apparatus by storing the program on a computer-readable recording medium. The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media from the other device that has a storage media storing the program/spftware. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A circuit design assisting apparatus for assisting designing of a circuit, comprising:
    a storage unit that stores configuration information indicating configuration patterns of components and wirings between the components used in a design-target circuit;
    an acquiring unit that acquires label setting information indicating an association of one or more labels with respective configuration information indicating a configuration pattern of components and wirings between the components of a circuit, the label setting information including one or more codes as the one or more labels different from each other in accordance with contents of a check item performed in designing of the circuit;
    a selecting unit that selects, from the storage unit, a configuration pattern of the design-target circuit that matches a configuration pattern included in the acquired label setting information; and a setting unit that sets a label corresponding to the acquired configuration pattern to the selected configuration pattern of the design-target circuit.

2. The apparatus according to claim 1, wherein the acquiring unit selects label setting information in accordance with a selected check item, when there are a plurality of label setting information in accordance with respective check items.

3. The apparatus according to claim 1, wherein, when there are a plurality of labels in the label setting information and the label setting information associates a priority to a label associated with a configuration pattern, the acquiring unit acquires a label in accordance with the priority, the selecting unit selects a configuration pattern of the design-target circuit from the storage unit in accordance with the priority, and the setting unit sets the acquired label to the selected configuration pattern in accordance with the priority.

4. The apparatus according to 1, wherein a configuration pattern of the label setting information contains information regarding a circuit trace start point, a circuit trace end point, and a trace signal input/output direction, and the selecting unit selects, from the storage unit, a configuration pattern of the design-target circuit that starts at the circuit trace start point, ends at the circuit trace end point, and has a signal input/output direction between the circuit trace start point and the circuit trace end point matching the trace signal input/output direction contained in the configuration pattern of the label setting information.

5. The apparatus according to claim 4, wherein the information regarding the circuit trace start point and the circuit trace end point is information indicating a terminal of a component used in the circuit.

6. The apparatus according to claim 4, wherein the information regarding the circuit trace end point indicates a number of operations of components from the circuit trace start point, and the selecting unit selects, from the storage unit, a configuration pattern of the design-target circuit having operations equal to the number of operations between the circuit trace start point and the circuit trace end point.

7. The apparatus according to claim 4, wherein, when the information regarding the circuit trace start point and the circuit trace end point contained in the configuration pattern of the label setting information includes an expression that is used as a regular expression, and the selecting unit selects, from the storage unit, a configuration pattern of the design-target circuit that matches the regular expression.

8. The apparatus according to claim 4, wherein the information regarding the circuit trace start point and the circuit trace end point is information regarding a macro used in the circuit.

9. The apparatus according to claim 4, wherein the information regarding the circuit trace start point and the circuit trace end point is a group of pieces of information.

10. The apparatus according to claim 1, wherein a configuration pattern of the label setting information contains information regarding a circuit trace start point and a number of operations of components from the circuit trace start point, and the selecting unit selects, from the storage unit, a configuration pattern of the design-target circuit that starts at the circuit trace start point and matches a configuration between the circuit trace start point to the number of operations indicated by the configuration pattern of the label setting information.

11. A non-transitory computer-readable medium storing a circuit design assisting program for causing a computer to execute a process comprising:

acquiring label setting information indicating an association of one or more labels with respective configuration information indicating a configuration pattern of components and wirings between the components of a circuit, the label setting information including one or more codes as the one or more labels different from each other in accordance with contents of a check item performed in designing of the circuit;

selecting a configuration pattern of a design-target circuit that matches a configuration pattern included in the acquired label setting information; and setting a label corresponding to the configuration pattern included in the acquired label setting information to the selected configuration pattern of the design-target circuit.

12. The computer-readable medium according to claim 11, wherein, when there are a plurality of label setting information in accordance with respective check items, the label setting information is selected in accordance with a selected check item.

13. The computer-readable medium according to claim 11, wherein, when there are a plurality of labels in the label setting information and the label setting information associates a priority to a label associated with a configuration pattern with the correspondence between the configuration information and the predetermined label, the acquiring operation of the circuit design assisting program includes acquiring a label in accordance with the priority, the selecting operation of the circuit design assisting program includes selecting a configuration pattern of the design-target circuit in accordance with the priority, and the setting operation of the circuit design assisting program includes setting the acquired label contained in the acquired label setting information to the selected configuration pattern in accordance with the priority.

14. The computer-readable medium according to claim 11, wherein the configuration pattern of the label setting information contains information regarding a trace start point, a trace end point, and a trace signal input/output direction, and wherein, at time of selection of a configuration pattern of the design-target circuit, a configuration pattern that starts at the trace start point, ends at the trace end point, and has a signal input/output direction between the trace start point and the trace end point matching the trace signal input/output direction contained in the acquired configuration pattern of the label setting information is selected.

15. The computer-readable medium according to claim 14, wherein the information regarding the trace start point and the trace end point is information indicating a terminal of a component used in the circuit.

16. A circuit design assisting method, comprising:

acquiring label setting information indicating an association of one or more labels with respective configuration information indicating a configuration pattern of components and wirings between the components of a circuit, the label setting information including one or more codes as the one or more labels different from each other in accordance with contents of a check item performed in designing of the circuit;

selecting, by a processor, a configuration pattern of a design-target circuit that matches a configuration pattern included in the acquired label setting information;

setting, by the processor, a label corresponding to the configuration pattern included in the acquired label setting information to the selected configuration pattern of the design-target circuit.

17. The method according to claim 16, wherein, when there are a plurality of label setting information in accordance with respective check items, label setting information is selected in accordance with a selected check item.

* * * * *

UNITED STATES PATENT AND TRADEMARK OFFICE
CERTIFICATE OF CORRECTION

PATENT NO. : 8,230,370 B2  
APPLICATION NO. : 12/507411  
DATED : July 24, 2012  
INVENTOR(S) : Tomokazu Nomura et al.

Page 1 of 1

It is certified that error appears in the above-identified patent and that said Letters Patent is hereby corrected as shown below:

Title Page, Item [57], Line 11, Delete "information." and insert -- information, --, therefor.
Column 11, Line 21, In Claim 4, delete "1," and insert -- claim 1, --, therefor.
Column 12, Line 24, In Claim 12, delete "the label" and insert -- label --, therefor.

Signed and Sealed this
Twenty-seventh Day of November, 2012

David J. Kappos
*Director of the United States Patent and Trademark Office*